Figure 1:
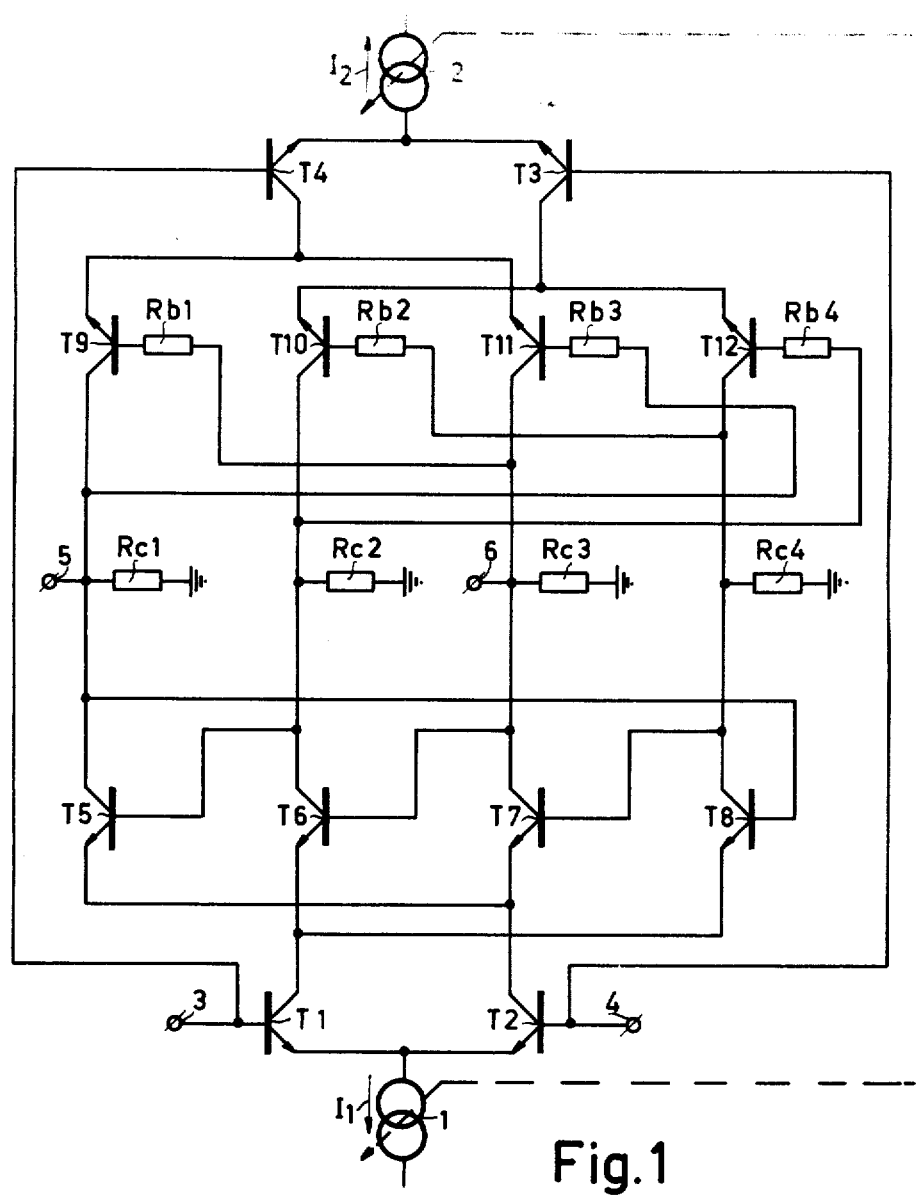

United States Patent

Kasperkovitz

[11] 4,242,601
[45] Dec. 30, 1980

[54] CIRCUIT ARRANGEMENT FOR FREQUENCY DIVISION

[75] Inventor: Wolfdietrich G. Kasperkovitz, Eindhoven, Netherlands

[73] Assignee: U.S. Philips Corporation, New York, N.Y.

[21] Appl. No.: 953,680

[22] Filed: Oct. 23, 1978

[30] Foreign Application Priority Data

Nov. 9, 1977 [NL] Netherlands ............... 7712314

[51] Int. Cl.$^3$ ............... H03K 23/00; H03K 27/00
[52] U.S. Cl. ............... 307/225 R; 307/223 R; 328/25; 328/30
[58] Field of Search ............... 307/225 R, 223 R; 328/30, 34, 39, 41, 42, 43, 25

[56] References Cited

U.S. PATENT DOCUMENTS

| | | | |
|---|---|---|---|
| 3,728,561 | 4/1973 | Brocker, Jr. | 307/225 R |
| 3,996,478 | 12/1976 | Kasperkovitz | 307/225 R |

*Primary Examiner*—John Zazworsky

*Attorney, Agent, or Firm*—William J. Streeter; Bernard Franzblau

[57] ABSTRACT

A wide-band frequency divider having a first and a second group of n transistors each, with their emitters in a first cyclic sequence alternately connected to the collectors of two transistors forming an input differential pair. The base electrode of any arbitrary transistor of said first cyclic sequence is always connected to the collector of the $(n-1)^{th}$ transistor after said arbitrary transistor in said first sequence. The frequency divider further comprises a third and a fourth group of n transistors each, also with their emitters alternatley connected in a second cyclic sequence to the collectors of two transistors which constitute an input differential pair. The collectors of the transistors in the second sequence are each time connected to the collector of the next transistor in the first sequence. The base electrode of any arbitrary transistor of said second cyclic sequence is always connected to the collector of the $n^{th}$ transistor after said arbitrary transistor in that sequence.

12 Claims, 7 Drawing Figures

CIRCUIT ARRANGEMENT FOR FREQUENCY DIVISION

The invention relates to a circuit arrangement for frequency division comprising first and second transistors with common-emitter-electrodes and adapted to be turned on alternately by input pulses and first and second groups of transistors with n transistors in each group. The transistors of said groups are arranged in a first cyclic electrical sequence so that in said first sequence the transistors of the first and second groups alternate with each other. The emitter electrodes of the transistors of the first and the second groups are connected to the collector electrodes of the first and the second transistors respectively, the base electrode of any arbitrary transistor of the first and the second groups always being coupled to the collector electrode of the $(n-1)^{th}$ transistor after said arbitrary transistor in said first sequence. The collector electrodes of the transistors of the first and second groups each lead to a collector load.

Such a circuit arrangement is known from an article by D. Kasperkovitz and D. Grenier "Travelling-Wave Dividers: A new concept for frequency Division", Microelectronics and Reliability, Vol. 16, pp. 127-134. This article describes a travelling wave divider of the type mentioned in the preamble, the base of each transistor of the first and second groups being connected to a point on a resistive divider between the collectors of the $(n-1)^{th}$ transistor in the specified sequence and the next transistor. From the article it appears that such a divider exhibits good properties at very high input frequencies. By varying the said voltage divider the optimum sensitivity can be shifted towards very high frequencies, but the sensitivity at lower input frequencies then decreases.

It is an object of the invention to provide a circuit arrangement of the type mentioned in the preamble having a satisfactory input sensitivity both at high and low input frequencies. In addition, it is an object of the invention to provide a circuit arrangement of the type mentioned in the preamble having an electronically variable sensitivity curve.

The invention is characterized in that the circuit arrangement further comprises third and fourth transistor with common emitter electrodes, to be turned on alternately by the input pulses, and third and fourth groups of transistors with n transistors in each group. The transistors of said third and fourth groups are arranged in a second cyclic electrical sequence so that in said second sequence the transistors of the third and the fourth groups each time alternate with each other. The emitter electrodes of the transistors of the third and the fourth groups being connected to the collector electrodes of the third and the fourth transistors respectively, the base electrode of any arbitrary transistor of the third and the fourth groups being always connected to the collector electrode of the $\underline{n}^{th}$ transistor after said arbitrary transistor in said second sequence, and the collector of a transistor of the third group being connected to the collector of a transistor of the first group and the collector of every next transistor of the third and fourth group in the second sequence being connected to the collector of the next transistor of the first and the second group in the first sequence, and means for the application of the input pulses in such a way that alternately both the first and the fourth transistors and both the second and the third transistors are conductive.

The invention is based on the following insights. Dividers of the type mentioned in the preamble can be described on the basis of travelling waves. For a high frequency input signal the collector currents of the transistors of the first and second group, as a function of time and of the position in the specified sequence, may be regarded as a travelling wave which propagates along said transistors in the said cyclic sequence. Similarly, the voltages at the base electrodes of these transistors may be regarded as a travelling wave. As these base electrodes are coupled to the collector electrodes, a phase shift may be defined between the two waves, which phase shift is determined by the coupling of the base electrode of a specific transistor of said defined sequence to the collector electrodes of other transistors of said sequence. In the aforementioned known travelling wave divider with each time two transistors in the first and the second group, the base electrode of the first transistor in a specified sequence is coupled to a point on a voltage divider between the collectors of the second and the third transistor of said sequence. If the base electrode of a first transistor of said sequence is fully coupled to the collector electrode of the third transistor of said sequence, said phase shift is 0°. If the first transistor of said sequence is conductive and the other three transistors are not conductive, the maximum of said collector current wave is then situated at said first transistor at that instant. The base voltages of the first, second and fourth transistors are then high and that of the third transistor is low so that the interpolated maximum is situated at said first transistor. This situation is stable because the conductive transistor has the highest base voltage. Thus, from a quasi-stationary point of view, the circuit arrangement is not suitable as a divider because the base voltages of the second and the fourth transistors of said sequence are equal so that, when switching from the first group of transistors to the second group of transistors, there is no preferred state for the second transistor of said sequence. It is then uncertain which of the transistors of the second group is turned on.

If in this known example the base of a first transistor of the first and second group in the specified sequence is connected to the collector of the second transistor of said sequence and if said first transistor is conducting, the base voltages of the first, the second, and the third transistors are high and that of the fourth transistor is low, so that the interpolated maximum is situated at the second transistor, i.e. a 90° phase shift. From a quasi-stationary point of view this situation is impossible because the base voltages of the first and the third transistors of said sequence are equal and the emitters are interconnected. However, the divider in accordance with the invention starts from this situation and a phase shift of 90° or more (base of the first transistor with the collectors of both the second and the first transistor) between the two waves is selected. From a dynamic point of view it is found that the circuit arrangement still operates at very high input frequencies, namely those input frequencies at which the switching time of the transistors begins to play a part and sufficiently compensates for the phase shift between the base voltage wave and the collector current wave. Thus, very high switching speeds are possible. In order to ensure that the circuit arrangement also operates at lower input frequencies the third and fourth groups of transistors have been added in order to produce an additional base voltage wave on the base electrodes of the transistors of the first and the second groups via the common collector impedances, so as to reduce said phase difference at the lower input frequencies. Thus, when a first transistor of the first and the second groups is conducting, the base voltage of the third transistor in the specified sequence will be reduced by the collector current wave of the transistors of the third and the fourth groups, so that for lower input frequencies, from a quasi-stationary point of view, a stable state is possible with the first transistor of said sequence conducting.

The maximum input frequency is determined by the phase difference between the base voltage wave and the collector current wave of the transistors of the first and the second groups. Therefore, it is advantageous that the circuit arrangement comprises means for limiting the maximum switching speed of the transistors of the third and the fourth groups relative to the maximum switching speed of the transistors of the first and the second groups. The collector current wave of the transistors of the third and the fourth groups then reduces said phase difference at lower input frequencies only.

Said limiting means can be realized in a simple and advantageous manner in that said means comprise resistors in the base conductors of the transistors of the third and the fourth groups which are of higher value than the resistors in the base conductors of the transistors of the first and the second groups.

These resistors may then be constituted entirely or partly by the internal resistance of the base material or by the base conductors. This step has the additional advantage that the influence of the collector-base capacitances of the transistors of the third and the fourth groups on the collector impedances of the transistors of the first and the second groups is reduced.

In a circuit arrangement in accordance with the invention it may be advantageous that the base electrode of any arbitrary transistor of the first and the second groups is always connected to a point on a voltage divider between the collectors of the $(n-2)$ and the $(n-1)$ transistors after said arbitrary transistor in the said sequence.

In this respect it is advantageous that the base electrode of any arbitrary transistor of the third and the fourth groups is always connected to a point on a voltage divider between the collector electrodes of the $(n-1)^{th}$ and the $n^{th}$ transistors after said arbitrary transistor in said second sequence.

In order to obtain an electronically adjustable sensitivity curve the invention is characterized in that the common emitter circuit of the first and the second transistors includes a first current source and the common emitter circuit of the third and the fourth transistors includes a second current source. The currents of said first and second current sources are adjustable relative to each other.

As the phase difference between the base voltage wave on the base electrodes of the transistors of the first and the second groups and the collector current wave of these transistors is also determined by the collector current wave on the collectors of the transistors of the third and fourth groups, this phase difference can be adjusted by adjusting said current sources.

Figure 2:
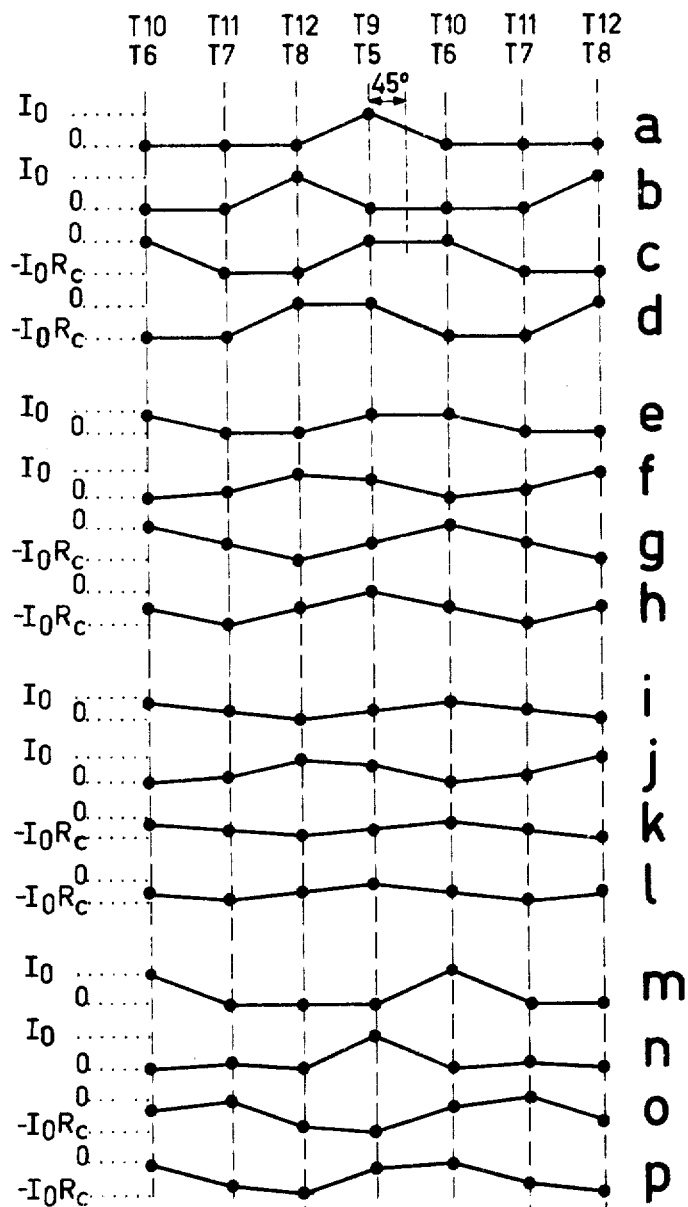
Figure 3:
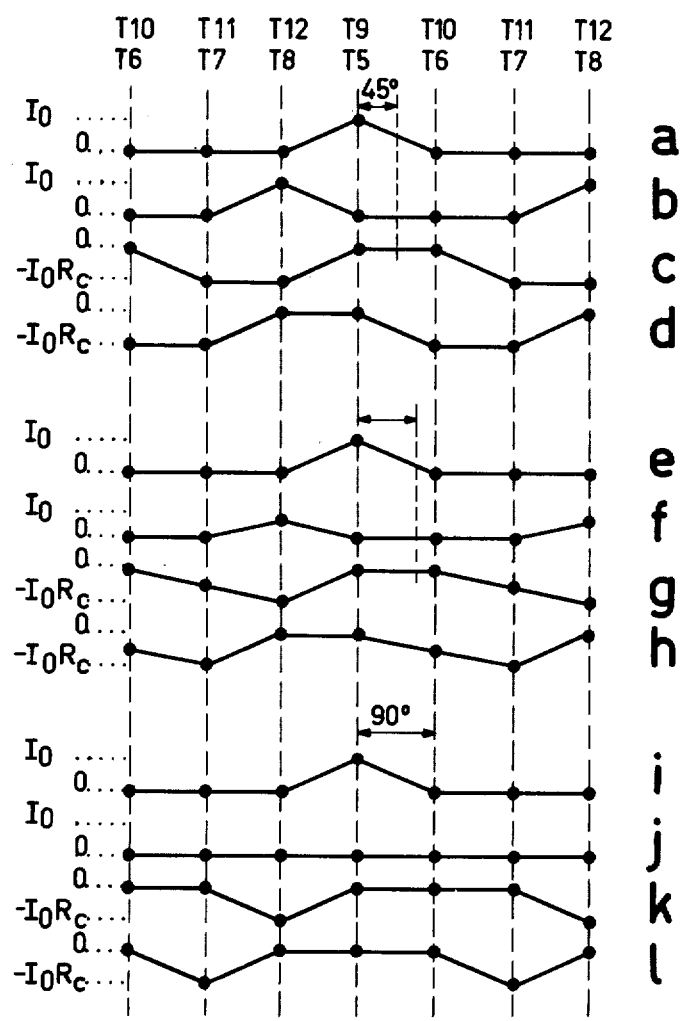
Figure 4:
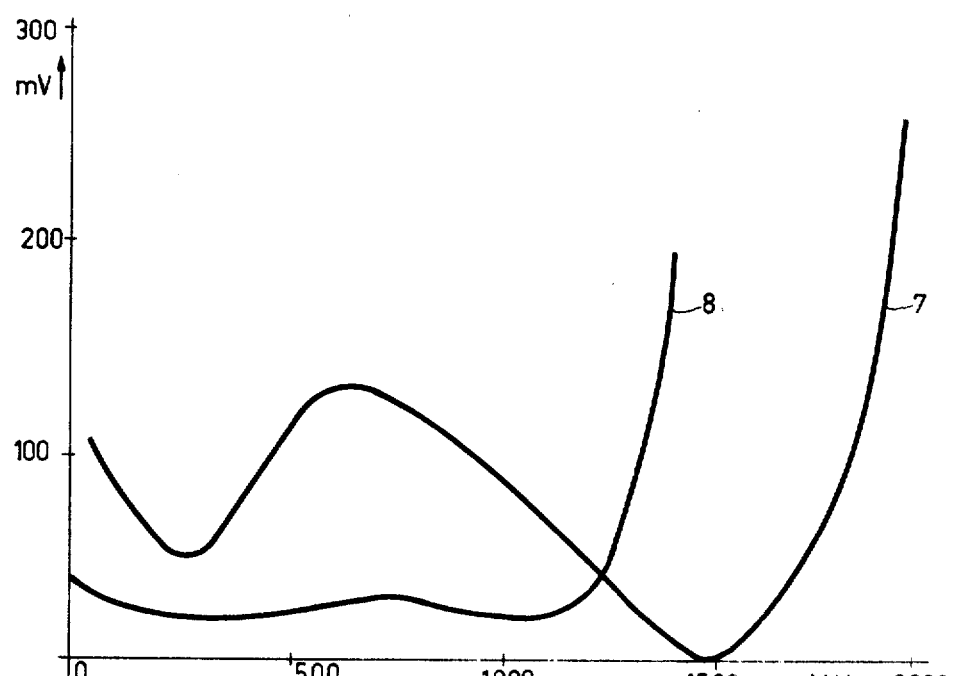
Figure 5:
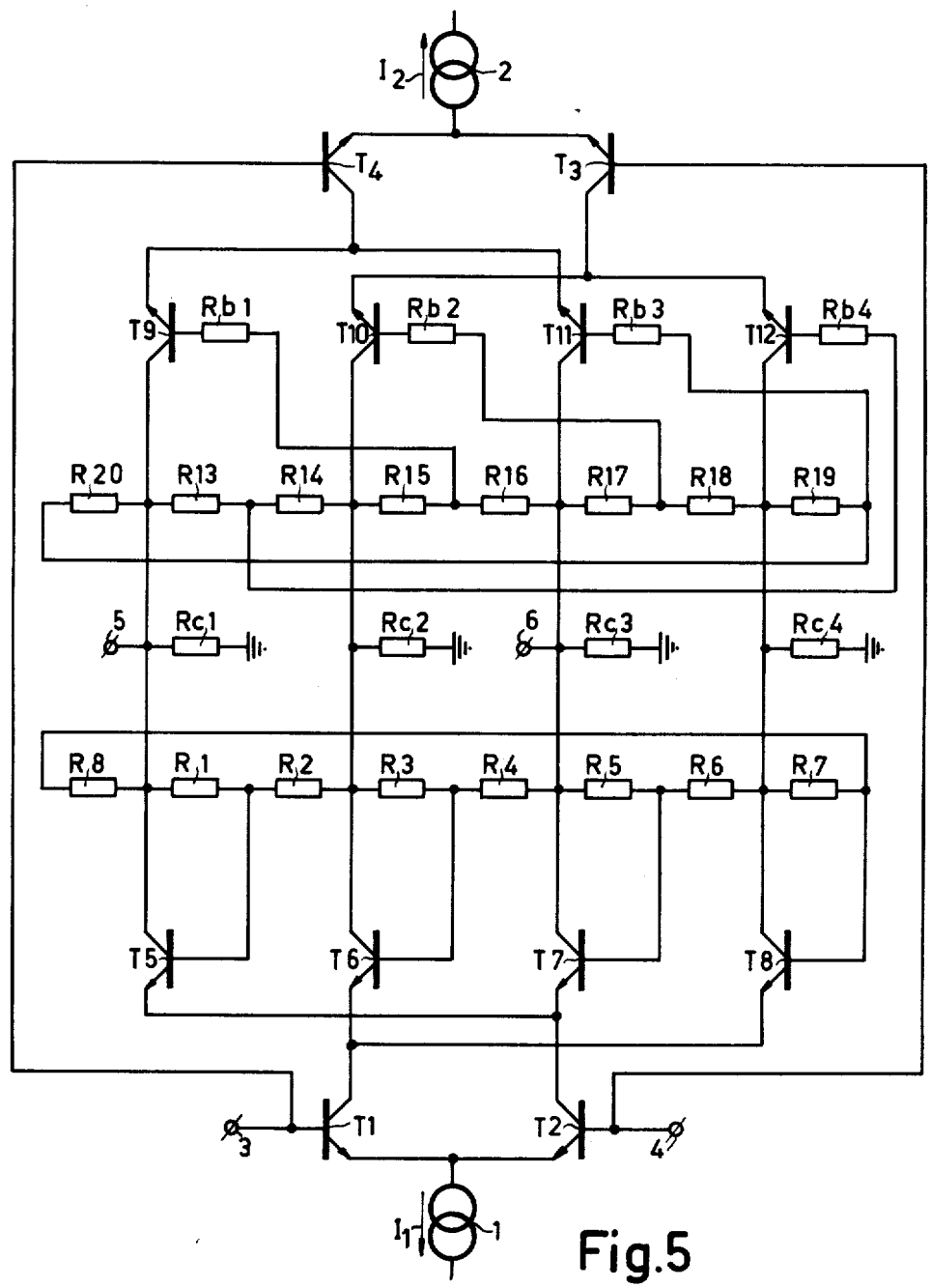
Figure 6:
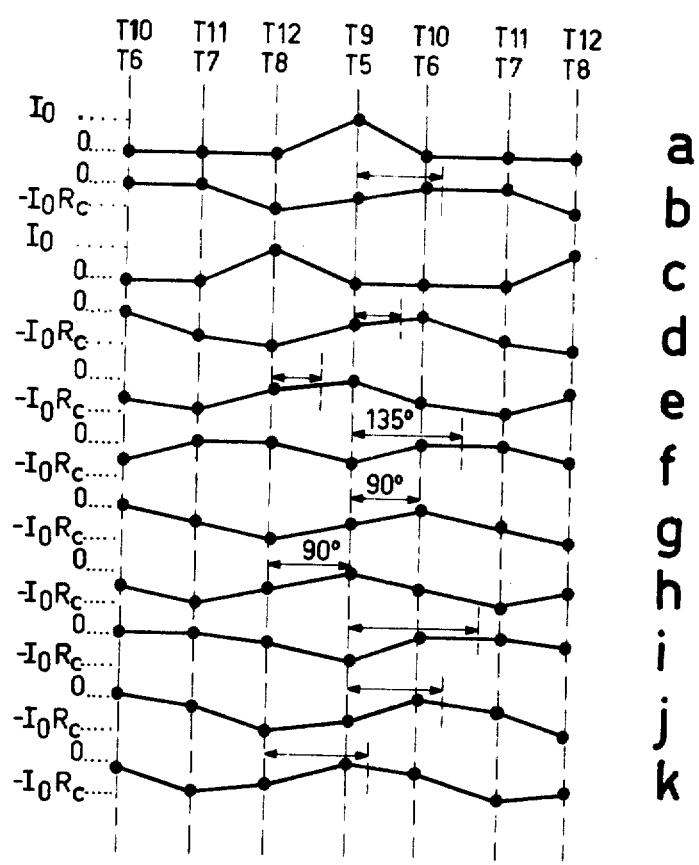
Figure 7:
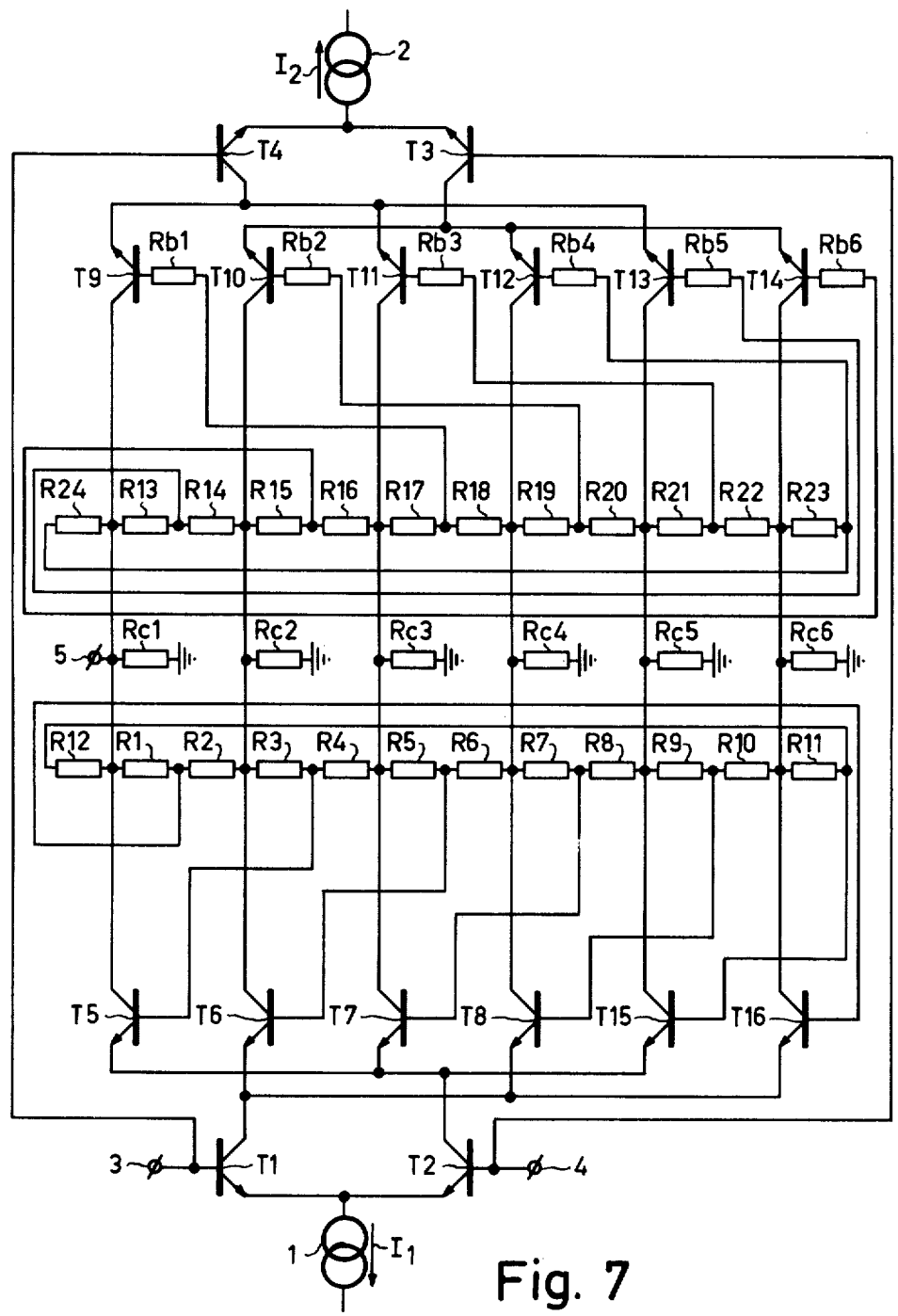

The invention will be described in more detail with reference to the drawing, in which:

FIG. 1 shows a first embodiment of a circuit arrangement in accordance with the invention, FIG. 2 shows some diagrams in explanation of the operation of the circuit arrangement of FIG. 1, FIG. 3 also shows some diagrams in explanation of the operation of the circuit arrangement of FIG.1, FIG. 4 shows two sensitivity curves relating to the circuit arrangement of FIG. 1, FIG. 5 shows a second embodiment of a circuit arrangement in accordance with the invention, FIG. 6 shows some diagrams in explanation of the operation of the circuit arrangement of FIG. 5, and FIG. 7 shows a third embodiment.

FIG. 1 shows a first embodiment of a divider arrangement in accordance with the invention. It comprises input terminals 3 and 4 which are connected to the base electrodes of transistors $T_1$ and $T_2$ respectively which have their emitters connected to a common current source 1 that carries a current $I_1$. The collector of transistor $T_1$ is connected to the emitters of transistors $T_6$ and $T_8$ and the collector of transistor $T_2$ is connected to the emitters of transistors $T_5$ and $T_7$. The collectors of the transistors $T_5$, $T_6$, $T_7$ and $T_8$ are connected to a power supply point, ground in the present example, via collector resistors $Rc_1$, $Rc_2$, $Rc_3$ and $Rc_4$ respectively. The base electrodes of the transistors $T_5$, $T_6$, $T_7$ and $T_8$ are connected to the collector electrodes of the transistors $T_6$, $T_7$, $T_8$ and $T_5$ respectively.

The input terminals 3 and 4 are also connected to the base electrodes of transistors $T_4$ and $T_3$ respectively. The emitter electrodes of the transistors $T_3$ and $T_4$ are connected to a common current source 2 which carries a current $I_2$. The collector electrode of transistor $T_3$ is connected to the emitter electrodes of transistors $T_{10}$ and $T_{12}$ and the collector electrode of the transistor $T_4$ is connected to the emitter electrodes of transistors $T_9$ and $T_{11}$. The collector electrodes of the transistors $T_9$, $T_{10}$, $T_{11}$ and $T_{12}$ are respectively connected to the collector electrodes of the transistors $T_5$, $T_6$, $T_7$ and $T_8$ and the base electrodes are respectively connected to the collector electrodes of the transistors $T_{11}$, $T_{12}$, $T_9$ and $T_{10}$ via base resistors $Rb_1$, $Rb_2$, $Rb_3$ and $Rb_4$ respectively. In the present example the collector electrodes of the transistors $T_5$ and $T_7$ are connected to output terminals 5 and 6 respectively and all transistors are of the npn-type.

FIG. 2 shows a number of diagrams in explanation of the operation of the circuit arrangement of FIG. 1. A part of a cyclic sequence of the transistors $T_9$, $T_{10}$, $T_{11}$ and $T_{12}$ and of the transistors $T_5$, $T_6$, $T_7$ and $T_8$ is plotted in the top of the Figure. The diagrams 2a, 2e, 2i and 2m show the collector currents of the transistors $T_5$, $T_6$, $T_7$ and $T_8$ at four different instants and the diagrams 2b, 2f, 2j and 2n show the collector currents of the transistors $T_9$, $T_{10}$, $T_{11}$ and $T_{12}$ at those instants. The diagrams 2c, 2g, 2k and 2o show the corresponding base voltages of the transistors $T_5$, $T_6$, $T_7$ and $T_8$ and the diagrams 2d, 2h, 2l and 2p the corresonding base voltages of the transistors $T_9$, $T_{10}$, $T_{11}$ and $T_{12}$.

The starting point is the situation where the voltage on input terminal 4 is high relative to the voltage on input terminal 3. Transistor $T_2$ then carries the current $I_1$ and transistor $T_3$ the current $I_2$. It is assumed that the currents $I_1$ and $I_2$ are equal to $I_0$ and that furthermore the transistors $T_5$ and $T_{12}$ are conductive, so that as is indicated in diagrams 2a and 2b the collector currents of the transistors $T_5$ and $T_{12}$ are equal to $I_0$ and voltages equal to $RcI_0$ appear across the resistors $Rc_1$ and $Rc_4$. These voltages reduce the base voltage of the transistors $T_7$, $T_8$, $T_{10}$ and $T_{11}$ relative to the base voltages of the transistors $T_5$, $T_6$, $T_9$ and $T_{12}$, as is shown in diagrams 2c and 2d. This situation is stable. This is because transistors $T_5$ and $T_7$ have a current $I_0$ as common emitter current, while transistor $T_5$ conducts this current $I_0$ and its base voltage is high relative to that of transistor $T_7$. Furthermore, the base voltage of transistor $T_6$ is high relative to that of transistor $T_8$, so that a preference is obtained for the transistor $T_6$ when the current $I_0$ is switched to transistor $T_1$. As the base voltage of transistor $T_{12}$ is high relative to the base voltage of transistor $T_{10}$ the situation is also stable in respect of transistors $T_9$, $T_{10}$, $T_{11}$ and $T_{12}$ and because the base voltage of transistor $T_9$ is high relative to that of transistor $T_{11}$ a preferred state is obtained also in this case. Similarly, the situation would be stable if it were assumed that transistor $T_{10}$ and transistor $T_7$ would conduct the currents $I_0$, which corresponds to a shift by two transistors in the specified cyclic sequence. If it were assumed that transistors $T_{10}$ and $T_5$, or $T_{12}$ $T_7$ would conduct the currents $I_0$, this assumption would give rise to an impossible situation. Therefore, it is correct to start from the situation with transistors $T_{12}$ and $T_5$ conducting.

Defining one cyclic sequence of the transistors $T_5$, $T_6$, $T_7$ and $T_8$ as 360 degrees, then the diagrams 2a and 2c show that the base voltage wave leads the collector current wave by 45°, which means a correct divider operation at low switching speeds.

If the voltage on inut terminal 3 is increased relative to the voltage on input terminal 4, the currents $I_1$ and $I_2$ switch over and now flow through transistors $T_1$ and $T_4$ respectively instead of the transistors $T_2$ and $T_3$ respectively. The collector currents of the transistors $T_3$ and $T_2$ then decrease and the collector currents of the transistors $T_1$ and $T_4$ increase. As a result of the base voltages shown in diagrams 2c and 2d the decreasing collector currents of transistors $T_2$ and $T_3$ initially flow through transistors $T_5$ and $T_{12}$ only and the increasing collector currents of the transistors $T_1$ and $T_4$ flow through the transistors $T_6$ and $T_9$ respectively. Extrapolation of this situation when switching over begins to the instant at which the transistors $T_1$, $T_2$, $T_3$ and $T_4$ each carry a current $\frac{1}{2}I_0$, this is the change-over point at which the voltage on input terminal 3 is equal to the voltage on input terminal 4, results in the currents and voltages shown in diagrams 2e, 2f, 2g and 2h. It is then found that transistor $T_5$ conducts and transistor $T_7$ does not conduct, while the base voltages of said transistors are equal. The same applies to transistors $T_{11}$ and $T_{12}$.

However, the increasing collector current of transistor $T_6$ reduces the base voltage of transistor $T_5$, whereas the decreasing collector current of transistor $T_{12}$ raises the base voltage of transistor $T_7$, which means a distribution of the decreasing collector current of transistor $T_2$ over the transistors $T_5$ and $T_7$. This temporarily increasing collector current of transistor $T_7$ reduces the base voltage of transistor $T_6$, whereas the base voltage of transistor $T_8$ is increased owing to the decreasing collector current of transistor $T_5$. However, this decreasing collector current of transistor $T_5$ is compensated for by the increasing collector current of transistor $T_9$, so that the base voltage of transistor $T_8$ remains low relative to the base voltage of transistor $T_6$, which consequently continues to carry the increasing collector current of transistor $T_1$. It is true that the temporarily increasing collector current of transistor $T_7$ reduces the base voltage of transistor $T_9$, but the sum of the collector currents of transistors $T_5$ and $T_9$ keeps the base voltage of transistor $T_{11}$ low relative to that of transistor $T_9$, so that transistor $T_9$ continues to carry the substantially full increasing collector current of transistor $T_4$. This situation extrapolated to the instant that the collector currents of the transistors $T_1$, $T_2$, $T_3$ and $T_4$ are equal to $\frac{1}{2}I_0$ is represented by diagrams 2i, 2j, 2k and 2l. Transistor $T_6$ carries a current which is substantially equal to $\frac{1}{2}I_0$, transistor $T_8$ is substantially currentless, and transistors $T_5$ and $T_7$ carry substantially equal current $\frac{1}{4}I_0$. With the collector currents of the transistors $T_9$, $T_{10}$, $T_{11}$ and $T_{12}$ (diagram 2j) the effect of the base resistors $Rb_1$ through $Rb_4$ has been allowed for. The base resistor $Rb_4$ delays the take-over of a portion of the collector current of transistor $T_3$ by transistor $T_{10}$ relative to a similar take-over by transistor $T_7$. Consequently, the collector current of transistor $T_{12}$ is still substantially equal to $\frac{1}{2}I_0$, while transistor $T_{10}$ is substantially currentless. Transistor $T_9$ carries a current which is substantially equal to $\frac{1}{2}I_0$ and transistor $T_{11}$ is substantially currentless. The base voltage of transistors $T_5$, $T_6$, $T_7$ and $T_8$ (diagram 2k) resulting from these currents are in conformity with the associated collector currents. The base voltages of the transistors $T_{10}$ and $T_{12}$ are substantially equal, while transistor $T_{12}$ conducts the substantially full decreasing collector current of transistor $T_3$, which is the result of the delaying action of the resistor $Rb_4$.

From the foregoing it follows that in the case of complete take-over of the currents $I_1$ and $I_2$ by transistors $T_1$ and $T_4$ respectively these currents will flow entirely through transistors $T_6$ and $T_9$ respectively. This also was true at input frequencies for which the delaying effect of the base resistor $Rb_4$ plays no part.

Diagrams 2m, 2n, 2o and 2p show the situation after take-over. This situation is identical to that in diagrams 2a, 2b, 2c and 2d, but shifted by one transistor in the cyclic sequence. After a total of four such take-overs or two changes of the voltage on input terminal 3 relative to the voltage on input terminal 4, the situation is again as shown in diagrams 2a, 2b, 2c and 2d. Thus, a frequency division by two is possible.

For the diagrams of FIG. 2 it has been assumed that $I_1 = I_2 = I_0$. However, the ratio of the currents $I_1$ and $I_2$ can be adjusted to values other than unity in order to influence the sensitivity curve at those switching speeds at which the transistors $T_9$, $T_{10}$, $T_{11}$ and $T_{12}$ are still capable of switching, for example in order to select the optimum sensitivity at a specific frequency. To clarify this FIG. 3 shows a number of diagrams similar to the diagrams of FIG. 2. The diagrams 3a, 3e and 3i represent the collector currents of the transistors $T_5$, $T_6$, $T_7$ and $T_8$ and the diagrams 3c, 3g and 3k the associated base voltages. The diagrams 3b, 3f and 3j show the collector currents of the transistors $T_9$, $T_{10}$, $T_{11}$ and $T_{12}$ and the diagrams 3d, 3h and 31 the associated base voltages. The diagrams 3a, 3b, 3c and 3d represent the situation for $I_1 = I_2 = I_0$, the diagrams 3e, 3f, 3g and 3h for $I_1 = I_0$ and $I_2 = \frac{1}{2}I_0$, and the diagrams 3i, 3j, 3k and 3l for $I_1 = I_0$ and $I_2 = 0$. In all these cases the situation has been selected in which transistors $T_5$ and $T_{12}$ are conducting. In diagrams 3a and 3b the transistors $T_5$ and $T_{12}$ each conduct a current $I_0$. The base voltages of the transistors $T_7$, $T_8$, $T_{10}$ and $T_{11}$ are then equal to $-RcI_0$, Rc being the resistance value of the resistors $Rc_1$, $Rc_2$, $Rc_3$ and $Rc_4$. The extrapolated maximum of the voltage wave on the base electrodes of the transistors $T_5$ through $T_8$ is then found to lead the maximum of the associated collector-current wave by 45°.

In diagram 3f the collector current of the conducting transistor $T_{12}$ is $\frac{1}{2}I_0$. With respect to the situation shown in diagrams 3a through 3d the base voltages of the transistors $T_7$ and $T_{10}$ are now equal to $-\frac{1}{2}I_0 R_c$. The extrapolated maximum of the voltage wave on the base electrodes of the transistors $T_5$ through $T_8$ shown in diagram 3g is now found to lead the maximum of the collector-current wave in diagram 3e by 45° to 90°.

Diagrams 3i, 3j, 3k and 3l show the limit case with $I_1=I_0$ and $I_2=0$. With respect to the situation in diagrams 3a through 3d transistor $T_{12}$ no longer carries any current and the base voltages of the transistors $T_7$ and $T_{10}$ are 0 V. The extrapolated maximum of the voltage wave on the base electrodes of transistors $T_5$ through $T_8$ in this limit case leads the associated collector-current wave by 90°.

If $I_2$ is selected to be greater than $I_1$, the phase difference lies between 0° and 45° with 0° as the limit case for $I_1=0$.

By means of two sensitivity curves FIG. 4 illustrates the effect of the current adjustment described with reference to FIg. 3. The input frequency in MHz has been plotted along the horizontal axis, and along the vertical axis the minimum average value in mV of a sinusoidal input voltage between input terminals 3 and 4. Curve 7 relates to $I_1=6.7$ mA and $I_2=1.4$ mA, whereas curve 8 applies to $I_1=3.3$ mA and $I_2=1.6$ mA.

Selection of a current $I_2$ which is smaller than $I_1$ has the additional advantage that for the transistors $T_9$ through $T_{12}$ transistors with smaller surface areas of the collector-base junctions can be selected than those of transistors $T_5$ through $T_8$, so that the collector-base capacitances are reduced, which capacitances load the collectors of transistors $T_5$ through $T_8$.

At high input frequencies the base resistors $Rb_1$ through $Rb_4$ prevent switching of transistors $T_9$ through $T_{12}$ and the current $I_2$ is divided uniformly among transistors $T_9$ through $T_{12}$. The result is a base voltage wave on the base electrodes of the transistors $T_5$ through $T_8$ which, except for a d.c. component which is equal to $-\frac{1}{4}I_2 Rc$, is identical to the voltage wave shown in diagram 3k. The phase difference with the corresponding collector current wave is then 90°. The circuit arrangement then performs a division at switching speeds of the same order of magnitude as the switching delays of the transistors $T_5$ through $T_8$. The resistors $Rb_1$ through $Rb_4$ should then be dimensioned so as to allow switching of the transistors $T_9$ through $T_{12}$ for switching speeds at which the section of the circuit arrangement of FIG. 1 with transistors $T_5$ through $T_8$ can no longer operate independently.

In order to increase the input frequencies at which the section with the transistors $T_5$ through $T_8$ can function independently, the phase difference between the base current wave and the associated collector-current wave may be selected to be greater than 90°. FIG. 5 shows how this can be done.

The circuit arrangement of FIG. 5 corresponds to that of FIG. 1, except for the connections of the base electrodes of transistors $T_5$ through $T_{12}$. In order to increase the phase difference between the collector-current wave and the base-current wave on the collectors and base electrodes of the transistors $T_5$ through $T_8$ respectively, the base of transistors $T_5$ is connected to a point between two resistors $R_1$ and $R_2$ which constitute a voltage divider, which resistors are moreover connected to the collector electrodes of transistor $T_5$ and transistor $T_6$ respectively. Similarly, the base electrodes of the transistors $T_6$, $T_7$ and $T_8$ are respectively connected to the collector electrodes of the transistors $T_6$, $T_7$ and $T_8$ via resistors $R_3$, $R_5$ and $R_7$ respectively and to the collector electrodes of the transistors $T_7$, $T_8$ and $T_5$ via resistors $R_4$, $R_6$ and $R_8$ respectively.

When it is assumed that the input frequency is so high that switching is effected by transistors $T_5$ to $T_8$ only, that transistor $T_5$ carries the current $I_1=I_0$ (diagram 6a), that the resistance values of resistors $R_1$ and $R_2$, of $R_3$ and $R_4$, of $R_5$ and $R_6$, and of $R_7$ and $R_8$ have the ratio 1:X, and for the sake of simplicity that the collector current of transistor $T_5$ almost completely flows through resistor $Rc_1$, then the base voltages of the transistors $T_5$, $T_6$, $T_7$ and $T_8$ will be $-(X/1+X) I_0 Rc$, 0, 0 and $-(1/1+X) I_0 Rc$ respectively, which values have been plotted in diagram 6b for $X=\frac{1}{3}$. The phase difference between the collector-current wave (diagram 6a) and the base-voltage wave (diagram 6b) is then 105°. The base-voltage wave for $X=1$ is shown in diagram 6f. The phase difference is then 135°. For $X=3$ the base-voltage wave is shown in diagram 6i. The phase difference is then substantially 150°. With the aid of these voltage dividers the phase difference may thus be selected greater than 90°.

For lower input frequencies at which switching is also effected by transistors $T_9$ through $T_{12}$ and transistor $T_{12}$ carries the current $I_2=I_0$ (diagram 6c), the base voltage waves for $X=\frac{1}{3}$, 1 and 3 respectively are shown in diagrams 6d, 6g and 6j. The phase differences are then found to be approximately 65°, 90° and approximately 115° respectively. From a quasi-stationary point of view, this means that for ratios 1:X with $X \geq 1$ the circuit arrangement can no longer operate at these lower input frequencies because the phase difference between the base-voltage wave and the collector-current wave is greater than 90° (base voltage of transistor $T_7$ higher than the base voltage of the conducting transistor $T_5$). However, in order to obtain a phase difference greater than 135° at high input frequencies without the phase difference exceeding 90° at lower switching speeds, a frequency-dependent voltage divider may be used, for example by shunting resistors $R_1$, $R_3$, $R_5$ and $R_7$ with capacitances, which capacitances may for example be constituted by the collector-base capacitances of the transistors $T_5$ through $T_8$.

In the circuit arrangement of FIG. 5 the base electrodes of the transistors $T_9$, $T_{10}$, $T_{11}$ and $T_{12}$ are respectively connected to the collector electrodes of the transistors $T_{10}$, $T_{11}$, $T_{12}$ and $T_9$ via the base resistors $Rb_1$, $Rb_2$, $Rb_3$, and $Rb_4$, and via resistors $R_{15}$, $R_{17}$, $R_{19}$, and $R_{13}$, respectively, and to the collector electrodes of the transistors $T_{11}$, $T_{12}$, $T_9$ and $T_{10}$ via the base resistors and resistors $R_{16}$, $R_{18}$, $R_{20}$ and $R_{14}$ respectively.

If the ratio of the values of the resistors $R_{13}$ and $R_{14}$, $R_{15}$ and $R_{16}$, $R_{17}$ and $R_{18}$ and of $R_{19}$ and $R_{20}$ is 1:a, diagrams 6e, 6h and 6k represent the base-voltage wave on the base electrodes of the transistors $T_9$ through $T_{12}$ for $a=\frac{1}{3}$, 1 and 3 respectively. For this it has been assumed that the collector resistors $Rc_1$ through $Rc_4$ are of sufficiently low value to ensure that substantially the full collector current of transistors $T_5$ and $T_{12}$ flows through resistors $Rc_1$ and $Rc_4$. The interpolated phase differences between the base-voltage wave and the collector-current wave associated with the transistors $T_9$ through $T_{12}$ are then approximately 65°, 90° and 115° respectively.

For $a=X$ the phase difference between the base-voltage wave on the base electrodes of the transistors $T_9$ through $T_{12}$ and the collector-current wave on the collector electrodes of these transistors is consequently the same as the corresponding phase difference for the transistors $T_5$ through $T_8$, which is also the case in the circuit arrangement of FIG. 1. If the two ratios a and x are unequal, said phase differences will be unequal, which under specific conditions may yield favourable results.

In the circuit arrangement of FIG. 5 the sensitivity curve of the circuit arrangement may also be selected suitably by varying the currents $I_1$ and $I_2$.

With the aid of the possibilities revealed, such as variation of the currents $I_1$ and $I_2$, the use of voltage dividers between the collector electrodes of the transistors $T_5$ through $T_8$ and between the collector electrodes of the transistors $T_9$ through $T_{12}$ in order to couple the base electrodes of these transistors to the collector electrodes, and dimensioning the base resistors $Rb_1$ through $Rb_4$, the optimum solution for each purpose can be selected.

The invention is not limited to divide-by-two circuits but also relates to n-dividers, where $n >> 2$. In order to illustrate this, FIG. 7 shows a circuit arrangement in accordance with FIG. 5 which has been extended to a divide-by-three circuit.

In comparison with the circuit arrangement of FIG. 5, the circuit arrangement of FIG. 7 has been extended to include a transistor $T_{15}$ having an emitter electrode with transistor $T_{15}$, whose emitter electrode is connected to the collector electrode of transistor $T_2$ and a collector electrode connected to a power supply point, in the present example ground, via a resistor $Rc_5$. The circuit of FIG. 7 further comprises a transistor $T_{16}$ whose emitter electrode is connected to the collector electrode of transistor $T_1$, and whose collector electrode is connected to ground via a resistor $Rc_6$. In addition there is transistor $T_{13}$, whose emitter electrode is connected to the collector electrode of transistor $T_4$ and whose collector electrode is connected to the collector electrode of transistor $T_{15}$, and there is transistor $T_{14}$ whose emitter electrode is connected to the collector electrode of transistor $T_5$ and whose collector electrode is connected to the collector electrode of transistor $T_{16}$. The collector electrodes of the transistors $T_{15}$ and $T_{16}$ are interconnected via a voltage divider including resistors $R_9$ and $R_{10}$, the collector electrodes of transistor $T_{16}$ and $T_5$ are interconnected via a voltage divider including resistors $R_{11}$ and $R_{12}$, the collector electrodes of the transistors $T_8$ and $T_{15}$ are interconnected via a voltage divider including resistors $R_7$ and $R_8$, the collector electrodes of the transistors $T_{12}$ and $T_{13}$ are interconnected via a voltage divider includes resistors $R_{19}$ and $R_{20}$, the collector electrodes of transistors $T_{13}$ and $T_{14}$ are interconnected via a voltage divider includes resistors $R_{21}$ and $R_{22}$, and the collector electrodes of the transistors $T_{14}$ and $T_9$ are interconnected via a voltage divider includes resistors $R_{23}$ and $R_{24}$. The base circuits of transistors $T_{13}$ and $T_{14}$ respectively include the resistors $Rb_5$ and $Rb_6$.

Of the transistors $T_5$, $T_6$, $T_7$, $T_8$, $T_{15}$ and $T_{16}$ the base electrode of transistor $T_5$ is connected to the junction point between resistors $R_3$ and $R_4$, the base electrode of the transistor $T_6$ to the junction point between resistors $R_5$ and $R_6$ etc. in a cyclic sequence. Of transistors $T_9$ through $T_{14}$ the base electrode of the transistor $T_9$ is connected to the junction point between resistors $R_{17}$ and $R_{18}$, the base electrode of transistor $T_{10}$ to the junction point between resistors $R_{19}$ and $R_{20}$ etc. in a cyclic sequence.

The circuit arrangement of FIG. 7 operates in the same way as that of FIG. 5. If at a specific instant the transistors $T_5$ and $T_{14}$ are conductive and the difference voltage between the inputs 3 and 4 changes polarity, transistors $T_6$ and $T_9$ respectively conduct currents $I_1$ and $I_2$ respectively. After every 6 zero passages of the difference voltage on the inputs 3 and 4, or after three periods of an input signal, the same situation again is obtained. Thus, the circuit divides the frequency of the input signal by three.

Generally speaking an n-divider in accordance with FIG. 7 ($n >> 2$) comprises a first series of 2n transistors whose emitters are alternately connected to the collector electrodes of the transistors $T_1$ and $T_2$ in a specific sequence and the base electrode of any arbitrary transistor of said sequence is connected to a point on a voltage divider between the collectors of the $(n-2)$ and the $(n-1)$ transistors after said arbitrary transistor in said sequences. The frequency divider of FIG. 7 further comprises a second series of 2n transistors, whose emitters are alternately connected to the collector electrodes of the transistors $T_3$ and $T_4$ in a specific sequence and whose collector electrodes are connected to the collector electrodes of the transistors of the first series. The base electrode of an arbitrary transistor of said second series is connected to a point on a voltage divider between the collectors of the $(n-1)^{th}$ and the $n^{th}$ transistor after said arbitrary transistor in said sequence.

What is claimed is:

1. A circuit for frequency division comprising, first and second input terminals, first and second transistors having emitter electrodes connected in common, first and second groups of transistors with each group comprising n transistors, n being at least two, each of said transistors having a collector, a base and an emitter, means connecting the emitter electrodes of the transistors of the first and second groups to the collector electrodes of the first and the second transistor respectively, to form a first cyclic electrical sequence of transistors with said sequence alternating between said first and second groups so that each transistor of one group is followed in said sequence by a transistor of the other group, means coupling the base electrodes of the transistors of the first cyclic sequence to the collector electrodes thereof so that the base electrode of any arbitrary transistor of the first cyclic sequence is always coupled to the collector electrode of the $(n-1)$ transistor of said first sequence after said arbitrary transistor, means coupling each collector electrode of the transistors of said first and second groups via a load to a point of reference voltage, third and fourth transistors having emitter electrodes connected in common, third and fourth groups of transistors with each group comprising the same number of n transistors as are present in the first and second groups of transistors, each of said transistors having a collector, a base and an emitter, means connecting the emitter electrodes of the transistors of the third and the fourth groups to the collector electrodes of the third and the fourth transistor respectively, to form a second cyclic electrical sequence of transistors with said second sequence alternating between said third and fourth groups so that each transistor of one group is followed in said sequence by a transistor of the other group, means coupling the base electrodes of the transistors of the third and fourth groups to the collector electrodes thereof so that the base electrode of any arbitrary transistor of the second cyclic electrical sequence is always coupled to the collector electrode of the $n^{th}$ transistor of said second sequence after said arbitrary transistor, means connecting the collector of a transistor of the third group to the collector of a transistor of the first group and the collector of every next transistor of the third and the fourth group in the second sequence to the collector of the next transistor of the first and the second group in the first sequence, and wherein said first, second, third and fourth transistors each have a control electrode, and means coupling said control electrodes to said first and second input terminals so that said first and second transistors and said third and fourth transistors are turned on alternately by an input signal applied to said input terminals and with the first and fourth transistors simultaneously conductive and the second and third transistors simultaneously conductive.

2. A circuit as claimed in claim 1 further comprising means for limiting the maximum switching speed of the transistors of the third and the fourth groups relative to the maximum switching speed of the transistors of the first and the second groups.

3. A circuit as claimed in claim 2, wherein said limiting means comprises resistance means in the base conductors of the transistors of the third and the fourth groups which is of higher value than any resistance means in the base conductors of the transistors of the first and the second group.

4. A circuit as claimed in any one of claims 1, 2 or 3 further comprising a voltage divider connected between the collectors of the first and second groups of transistors, and wherein the base electrode of any arbitrary transistor of the first and the second group is always connected to a point on said voltage divider between the collectors of the $(n-2)$ and the $(n-1)$ transistors after said arbitrary transistor in said first sequence.

5. A circuit as claimed in claim 4 further comprising a second voltage divider connected between the collectors of the third and fourth groups of transistors, and wherein the base electrode of any arbitrary transistor of the third and the fourth group is always connected to a point on said second voltage divider between the collector electrodes of the $(n-1)$ and the $n^{th}$ transistors after said arbitrary transistor in said second sequence.

6. A circuit as claimed in any one of claims 1, 2 or 3 further comprising, a first current source connected in the common emitter circuit of the first and the second transistors, and a second current source connected in the common emitter circuit of the third and the fourth transistors and wherein the currents of said first and second current sources are adjustable relative to each other.

7. A frequency divider comprising, first and second signal input terminals, first and second transistors having emitter electrodes connected in common to a first supply terminal for a source of electric energy, means coupling a control electrode of the first and second transistors to the first and second signal input terminals respectively, whereby an input signal at said terminals alternately operates said transistors, a first group of n transistors where n is at least two, a second group of n transistors equal in number to the first group, each of said transistors having a collector, a base and an emitter, means connecting the emitters of the first group of transistors to the collector of the first transistor and the emitters of the second group of transistors to the collector of the second transistor, means intercoupling the base electrodes of the transistors of the first group to the collector electrodes of the transistors of the second group and the base electrodes of the transistors of the second group to the collector electrodes of the transistors of the first group in a given cyclic electric sequence whereby the transistors of said first and second groups are made to conduct in a given cyclic sequence in response to an input signal at the signal input terminals, said intercoupling means producing a traveling wave of collector currents propagating along the transistors in said cyclic sequence and a traveling wave of base voltages propagating along the transistors in said cyclic sequence and with a given phase shift therebetween, load means coupled to the collectors of said first and second groups of transistors, and means coupled to said signal input terminals and to the base electrodes of the transistors of said first and second groups of transistors for altering the value of said given phase shift between the collector current wave and the base voltage wave as a function of the frequency of an input signal.

8. A frequency divider as claimed in claim 7 wherein said phase shift altering means comprises, third and fourth transistors having emitter electrodes connected in common to a second supply terminal for a source of electric energy and control electrodes coupled to the first and second signal input terminals, respectively, whereby the third and fourth transistors are alternately operated by an input signal, third and fourth groups of transistors with each said group comprising the same number of n transistors as are present in said first and second transistor groups, each of said transistors having a collector, a base and an emitter, means connecting the emitters of the third group of transistors to the collector of the third transistor and the emitters of the fourth group of transistors to the collector of the fourth transistor, means coupling the collectors of the third and fourth groups of transistors to corresponding collectors of the first and second groups of transistors, respectively, and means intercoupling the base and collector electrodes of the transistors of the third and fourth groups of transistors so that the transistors of the third and fourth groups conduct in a cyclic sequence that is out of phase with that of the first and second groups of transistors.

9. A frequency divider as claimed in claim 8 further comprising means for limiting the maximum switching speed of the transistors of the third and fourth group relative to the maximum switching speed of the transistors of the first and the second group.

10. A frequency divider as claimed in claims 7, 8 or 9 further comprising a voltage divider coupled between the collector electrodes of the transistors of said first and second groups of transistors and wherein the base electrode of any arbitrary transistor of the first and the second group is always connected to a point on said voltage divider between the collectors of the $(n-2)$ and the $(n-1)$ transistors following after said arbitrary transistor in said first sequence.

11. A frequency divider as claimed in claim 10 further comprising a second voltage divider coupled between the collector electrodes of the transistors of said third and fourth groups of transistors and wherein the base electrodes of any arbitrary transistor of the third and the fourth group is always connected to a point on said second voltage divider between the collector electrodes of the $(n-1)$ and $n^{th}$ transistor following after said arbitrary transistor in said second sequence.

12. A frequency divider as claimed in claims 8 or 9 further comprising first and second current sources connected to the common emitter electrodes of the first and second transistors and the common emitter electrodes of the third and fourth transistors, respectively, and wherein the currents of said first and second current sources are adjustable relative to one another.

* * * * *